United States Patent
Ie et al.

(10) Patent No.: US 11,263,368 B2
(45) Date of Patent: Mar. 1, 2022

(54) COMPUTING SYSTEM FOR GAS FLOW SIMULATION, AND SIMULATION METHOD

(71) Applicant: SAMSUNG ELECTRONICS CO., LTD., Suwon-si (KR)

(72) Inventors: Sang-Yub Ie, Hwaseong-si (KR); Jung-Geun Jee, Seoul (KR); Jae-Myung Choe, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 752 days.

(21) Appl. No.: 15/996,484

(22) Filed: Jun. 3, 2018

(65) Prior Publication Data

US 2019/0080033 A1 Mar. 14, 2019

(30) Foreign Application Priority Data

Sep. 14, 2017 (KR) .......................... 10-2017-0117746

(51) Int. Cl.
*G06F 30/20* (2020.01)

(52) U.S. Cl.
CPC .................................... *G06F 30/20* (2020.01)

(58) Field of Classification Search
CPC .......... G06F 30/20; G06F 30/25; G06F 30/27; G06F 30/28
See application file for complete search history.

(56) References Cited

U.S. PATENT DOCUMENTS

| 5,946,647 A | 8/1999 | Miller et al. |
|---|---|---|
| 6,113,705 A | 9/2000 | Ohashi et al. |
| 8,910,590 B2 | 12/2014 | Martin et al. |
| 9,157,730 B2 | 10/2015 | Rajagopalan et al. |
| 9,600,624 B2 | 3/2017 | Jain |

(Continued)

FOREIGN PATENT DOCUMENTS

| KR | 100847963 | 7/2008 |
|---|---|---|
| KR | 101472706 | 12/2014 |

(Continued)

OTHER PUBLICATIONS

Panda, Rajesh Kumar, P. Sreekala, and B. V. S. S. S. Prasad. "Computational and experimental study of conjugate heat transfer from a flat plate with shower head impinging jets." In International Heat Transfer Conference, vol. 49408, pp. 267-276. 2010. (Year: 2010).*

*Primary Examiner* — Chuen-Meei Gan
(74) *Attorney, Agent, or Firm* — Volentine, Whitt & Francos, PLLC

(57) ABSTRACT

A computing system includes memory configured to store instructions and a nozzle library, and a processor configured to access the memory and to execute the instructions. The instructions cause the computing system to select at least one nozzle unit as a selected at least one nozzle unit based on the nozzle library and to place the selected at least one nozzle unit at corresponding location coordinates, to create multiple volume meshes for the process chamber, and to simulate the flow of the gas through the selected at least one nozzle unit in the process chamber based on the multiple volume meshes in the process chamber. The nozzle library includes information about multiple nozzle units of which each has multiple volume meshes formed therein. The nozzle units have different shapes from each other.

17 Claims, 17 Drawing Sheets

(56) References Cited

U.S. PATENT DOCUMENTS

| | | |
|---|---|---|
| 2007/0181531 A1 | 8/2007 | Horiguchi et al. |
| 2007/0218204 A1 | 9/2007 | Garg et al. |
| 2012/0129296 A1* | 5/2012 | Rolin ................ C23C 16/45565 |
| | | 438/99 |
| 2014/0172388 A1* | 6/2014 | Yamakawa ............. G06T 17/20 |
| | | 703/2 |
| 2015/0226540 A1 | 8/2015 | Rajagopalan et al. |
| 2016/0125555 A1* | 5/2016 | Branets ................ G06T 17/205 |
| | | 705/348 |
| 2016/0348244 A1 | 12/2016 | Sabri et al. |
| 2017/0056936 A1 | 3/2017 | Nishiyama |
| 2017/0096738 A1 | 4/2017 | Kurita et al. |
| 2019/0130642 A1* | 5/2019 | Elber ...................... G06T 15/08 |

FOREIGN PATENT DOCUMENTS

| | | |
|---|---|---|
| KR | 1020150074008 | 7/2015 |
| KR | 101691558 | 12/2016 |
| KR | 1020170026198 | 3/2017 |

\* cited by examiner

COMPUTING SYSTEM FOR GAS FLOW SIMULATION, AND SIMULATION METHOD

CROSS-REFERENCE TO RELATED APPLICATION

This U.S. non-provisional patent application claims the benefit of priority under 35 U.S.C. § 119 to Korean Patent Application No. 10-2017-0117746, filed on Sep. 14, 2017, in the Korean Intellectual Property Office, the disclosure of which is incorporated herein in its entirety by reference.

BACKGROUND

1. Field

The present disclosure relates to a computing system for gas flow simulation and a simulation method. More particularly, the present disclosure relates to a computing system for simulating a flow of gas provided inside a process chamber, and a simulation method.

2. Description of Related Art

A process chamber includes a shower head connected to a gas supply inlet in order to uniformly deposit a material film on a wafer or uniformly etch the material film. Gas supplied through the gas supply inlet is uniformly sprayed onto the wafer through the shower head. The shower head includes multiple nozzles and gas is sprayed through apertures of the nozzles.

SUMMARY

The present disclosure provides a computing system for simulating a flow of gas in a process chamber in a short time, and a simulation method.

According to an aspect of the present disclosure, a computing system is provided for simulating a flow of gas supplied into a process chamber through a shower head. The computing system includes memory and a processor. The memory is configured to store instructions and a nozzle library including information about multiple nozzle units having differing shapes and each of which each has multiple volume meshes formed therein. The processor is configured to access the memory and to execute the instructions. When executed by the processor, the instructions cause the computing system to select at least one nozzle unit as a selected at least one nozzle unit based on the nozzle library and to place the at least one nozzle unit at corresponding location coordinates. The instructions also cause the computing system to create multiple volume meshes for the process chamber, and to simulate (e.g., compute) the flow of the gas through the selected at least one nozzle unit in the process chamber based on the multiple volume meshes in the process chamber.

According to another aspect of the present disclosure, a computing system is provided for simulating a flow of gas supplied into a process chamber. The computing system includes memory and a processor. The memory is configured to store instructions and a nozzle library comprising information about a first nozzle unit in which multiple volume meshes are formed and a second nozzle unit in which multiple nozzle units are formed. The volume meshes in the first nozzle unit may be different from the volume meshes in the second nozzle unit. The processor is configured to access the memory and to execute the procedures. When executed by the processor, the instructions cause the computing system to select at least one nozzle unit as a selected at least one nozzle unit based on the nozzle library and to place the at least one nozzle unit at corresponding location coordinates. The instructions also cause the computing system to create multiple volume meshes for the process chamber, and to simulate (e.g., compute) the flow of the gas through the selected at least one nozzle unit in the process chamber based on the volume meshes in the process chamber.

According to a further aspect of the present disclosure, a method of simulating a flow of gas supplied into a process chamber is provided. The method includes selecting at least one nozzle unit as a selected at least one nozzle unit based on a nozzle library including information about a first nozzle unit in which multiple volume meshes are formed and a second nozzle unit in which multiple volume meshes are formed. The volume meshes in the first nozzle unit may be different from the volume meshes in the second nozzle unit. The method may also include setting location coordinates at which the selected at least one nozzle unit is to be placed, placing the selected at least one nozzle unit at the location coordinates, and simulating (e.g., computing) the flow of the gas through the selected at least one nozzle unit in the process chamber based on volume meshes in the at least one nozzle unit placed at the location coordinates.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Hereinafter, embodiments of the present disclosure will be described in detail with reference to the accompanying drawings.

Figure 1:
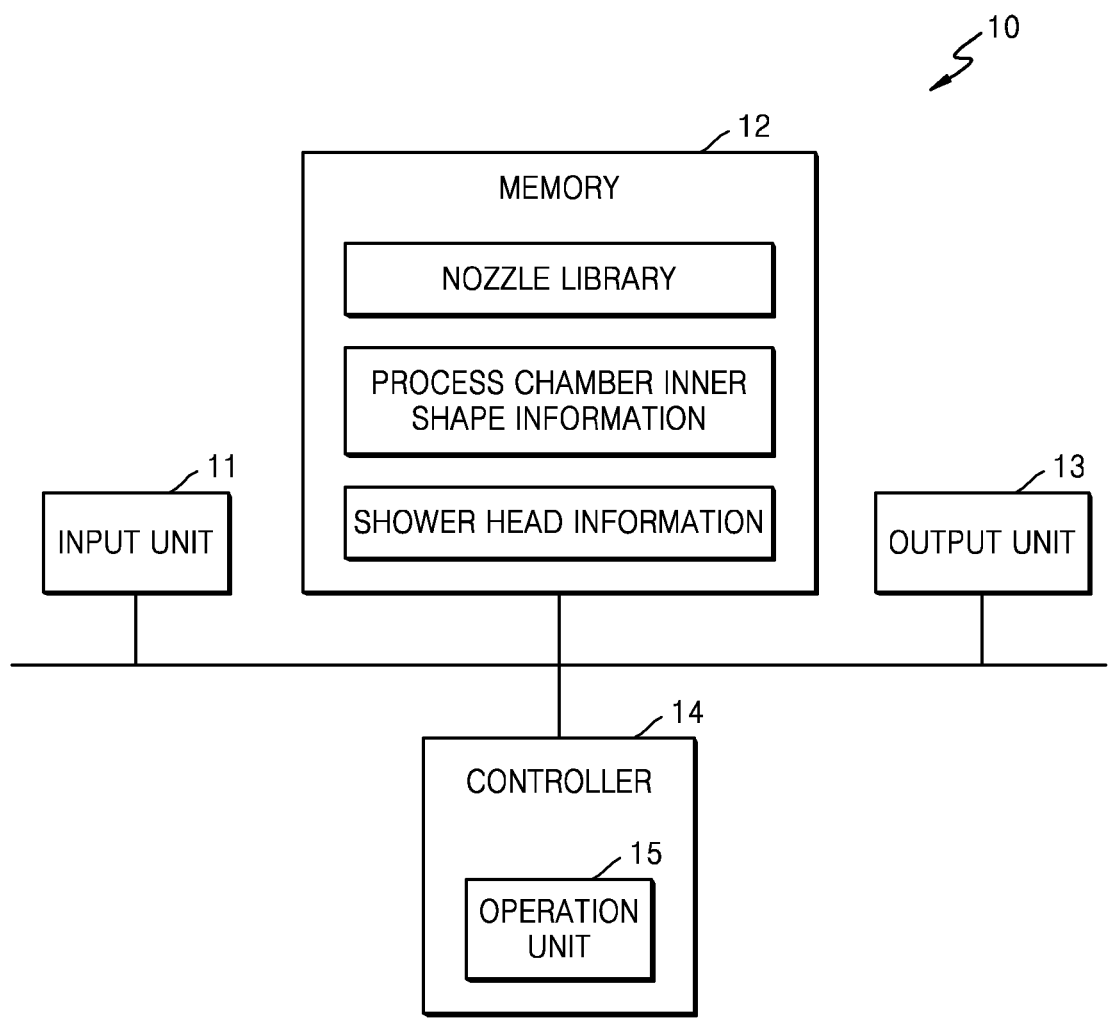
FIG. 1 is a block diagram illustrating a simulation system according to some embodiments of the inventive concept.

FIG. 1 is a block diagram illustrating a simulation system 10 according to some embodiments of the present disclosure. The simulation system 10 may be defined as a system that performs various functions. For example, as a computer-based simulation system, the simulation system 10 may be a computing system which receives various kinds of information related to a simulation process and outputs a simulation result.

The simulation system 10 may simulate a flow of gas, which is supplied to a process chamber through a shower head having multiple nozzles. The simulation of the flow of gas by the simulation system uses a nozzle library including information about the nozzles having various shapes. The simulation of a flow of gas may result in a visualization of the flow of gas through the shower head in two-dimensions or three-dimensions, or data and information that can be used to produce such a visualization.

The simulation system 10 may include an input unit 11, memory 12, an output unit 13, and a controller 14. The controller 14 may include an operation unit 15. The input unit 11, the memory 12, the output unit 13, and the controller 14 may be connected to one another through a bus (not labelled). The controller 14 may control the input unit 11, the memory 12, and the output unit 13.

The input unit 11 may be formed of a keyboard, an operation panel, or various data readers. The memory 12 is tangible and non-transitory, as is true of all other elements of the simulation system of FIG. 1. The memory 12 may be formed of various kinds of semiconductor memory, a hard disc, or the like. The output unit 13 may be formed of a monitor, a printer, a recorder, etc.

The controller 14 may perform various processing operations related to a simulation and may be implemented as a processor. The controller 14 may perform various processing operations to simulate a flow of gas inside a process chamber, using computational fluid dynamics (CFD). For example, the controller 14 may discretize the inner space of the process chamber into volume meshes, may set up an equation of motion of (e.g., in, through and/or around) each volume mesh, and may compute a flow of gas using a numerical algorithm. A process chamber is described below, and is an enclosure in which a deposition process is or can be performed. Insofar as a gas is pumped into and vacuumed out of such a process chamber, the simulation of the flow of gas can be used to optimize selections of and placements of nozzle units for different processes and different process chambers, and ultimately results in improved processing resulting in production/fabrication of semiconductors.

The controller 14 may select at least one nozzle unit from among multiple nozzle units based on a nozzle library without separately discretizing a nozzle area formed in a shower head of a process chamber into volume meshes. A nozzle unit may be an individual configuration for or more nozzles as described herein. The controller 14 may discretize an upper area above the nozzle area and a lower area below the nozzle area into multiple volume meshes.

The memory 12 may store various kinds of information used for operations performed by the controller 14 and may store various operation results. In addition, the result of simulating a flow of gas in a process chamber may be stored in the memory 12. Additionally, information about the inner shape of a process chamber, i.e., process chamber inner shape information, and information about a shower head, i.e., shower head information, may be stored in the memory 12.

The memory 12 may store a control program (e.g., instructions and/or one or more algorithms) used for a gas flow simulation in a process chamber. The controller 14 may perform various operations related to embodiments of the present disclosure by executing the control program stored in the memory 12.

The memory 12 may be implemented as volatile memory including dynamic random-access memory (DRAM) or non-volatile memory including flash memory.

According to some embodiments, gas flow inside a process chamber may be simulated and the shape of each of multiple nozzle units provided to uniformly supply gas onto a wafer inserted into a process chamber may be determined. In a simulation method using the simulation system 10 according to some embodiments of the present disclosure, information about the multiple nozzle units may be stored in a nozzle library in advance, so that gas flow simulation time can be reduced and the amount of time taken to select the optimal shape of a nozzle unit and manufacture or otherwise procuring a shower head including the multiple nozzle units can also be reduced.

Figure 2:
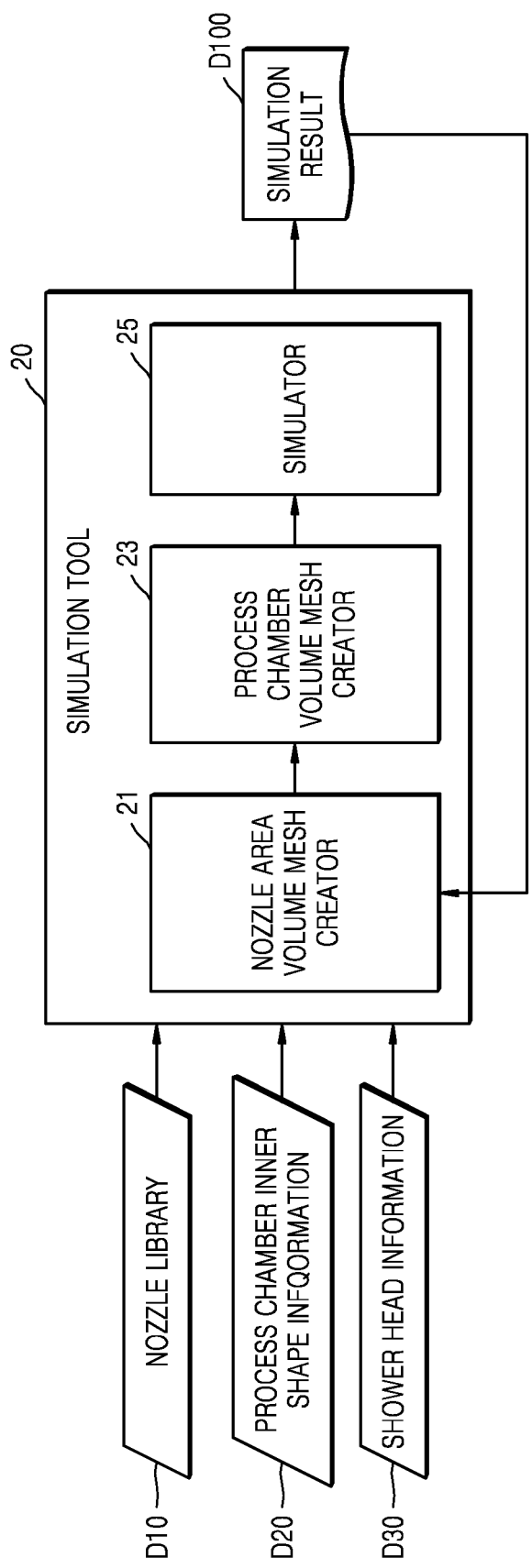
FIGS. 2 through 4 are block diagrams illustrating examples in which functions according to some embodiments of the present disclosure are provided in a simulation tool in various forms.
Figure 3:
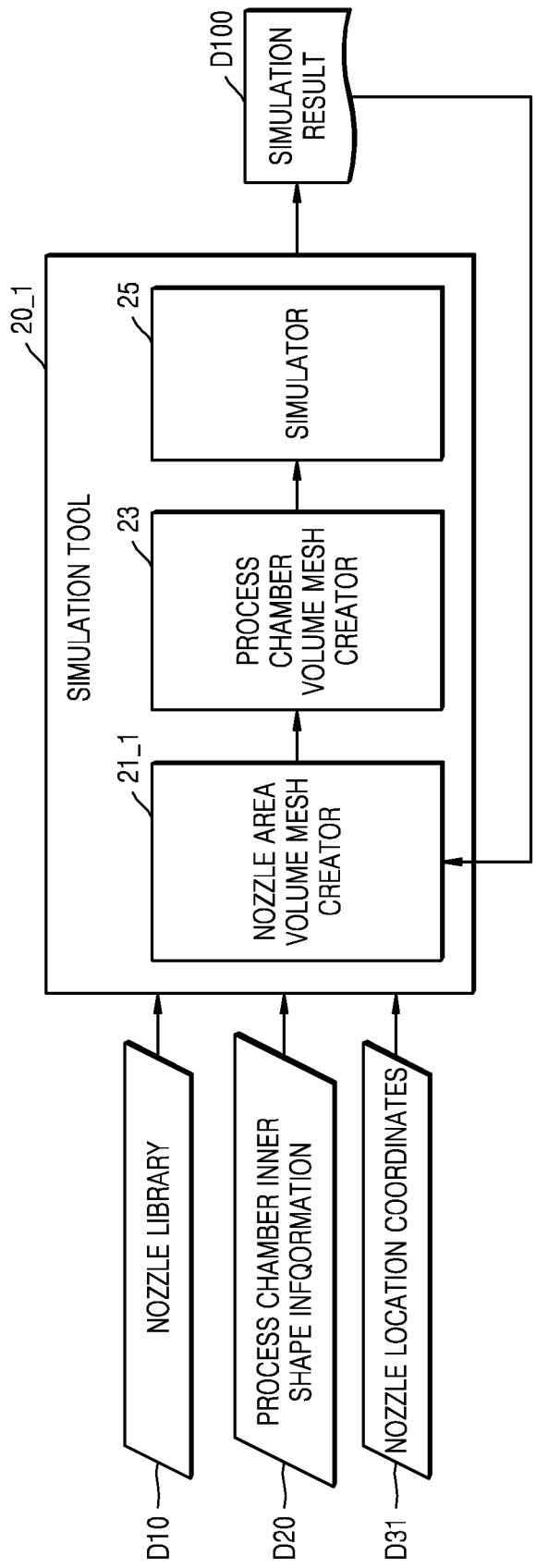
Figure 4:
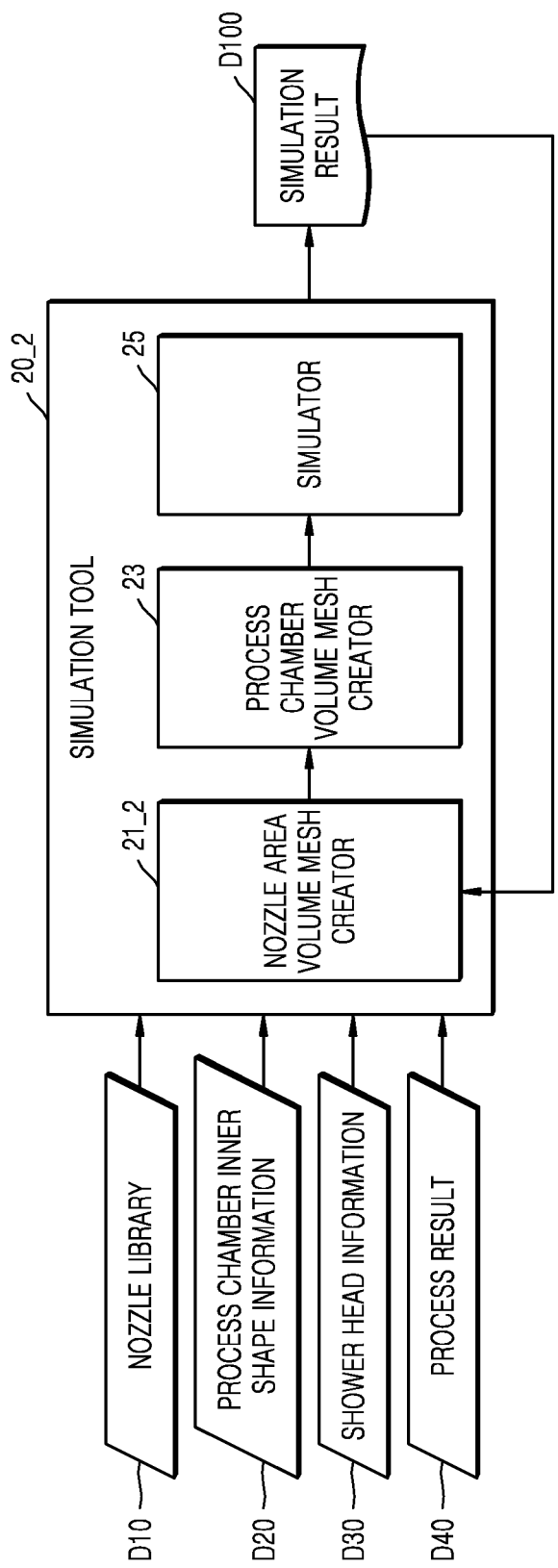

Operations according to some embodiments illustrated in FIG. 1 will be described in detail with reference to FIGS. 2 through 4. FIGS. 2 through 4 are block diagrams illustrating examples in which functions according to some embodiments of the present disclosure are provided in a simulation tool in various forms. A simulation tool may be a machine (e.g., a computer) that executes instructions, and/or a set of instructions stored as an algorithm on a computer readable medium. That is, a simulation tool in the embodiments of FIGS. 2 through 4 may be embodied as discrete algorithms stored on a computer readable medium and executed by a machine (e.g., a computer).

Referring to FIG. 2, a simulation system may include a simulation tool 20. The simulation tool 20 may include a nozzle area volume mesh creator 21, a process chamber volume mesh creator 23, and a simulator 25. The nozzle area volume mesh creator 21, the process chamber volume mesh creator 23, and the simulator 25 may each be implemented as a program which can be executed by a computer.

A nozzle library D10, process chamber inner shape information D20, and shower head information D30 may be provided to the simulation tool 20.

The nozzle library D10 may include information about multiple nozzle units. For example, the nozzle library D10 may include information about a shape of each nozzle unit and information about volume meshes created in each of the nozzle units. The nozzle library D10 may include information about multiple nozzle units, which have the same shape and in which volume meshes having different characteristics are created, and may also include information about multiple nozzle units which have different shapes. The volume meshes having different characteristics may be volume meshes having different shapes and/or having different densities. Multiple volume meshes will be described in detail with reference to FIGS. 7A and 7B below.

The nozzle area volume mesh creator 21 may receive the nozzle library D10 and select a nozzle unit using the information about the multiple nozzle units included in the nozzle library D10. The nozzle area volume mesh creator 21 may select the nozzle unit based on process chamber inner shape information D20. For example, the nozzle area volume mesh creator 21 may select at least one nozzle unit based on a location of an exhaust outlet of a process chamber or a location of a susceptor on which a wafer is mounted. A susceptor may be generally considered a material, such as a piece of metallic film, with an ability to absorb electromagnetic (EM) energy and convert the electromagnetic energy to heat. An example of a susceptor is an inclined support plate on which the wafer is mounted/supported.

Alternatively, the nozzle library D10 may include information about nozzle units reflecting an aging effect (e.g., of the process chamber and/or of the nozzle units) and information about nozzle units not reflecting the aging effect. The nozzle area volume mesh creator 21 may select at least one nozzle unit, taking the aging effect into account.

The nozzle area volume mesh creator 21 may select one nozzle unit but is not limited thereto. The nozzle area volume mesh creator 21 may select multiple nozzle units as selected nozzle units, such as multiple nozzle units having different shapes. Cases where the nozzle area volume mesh creator 21 selects multiple nozzle units will be described with reference to FIGS. 9A and 9B below.

The nozzle area volume mesh creator 21 may receive shower head information D30 and may set location coordinates at which at least one selected nozzle unit will be placed. A shower head may have a circular plate shape and the nozzle area volume mesh creator 21 may set location coordinates, at which a selected nozzle unit will be placed, with respect to the center of the circle. The nozzle area volume mesh creator 21 may place the at least one selected nozzle unit at the location coordinates which have been set. The location coordinates of a nozzle unit will be described with reference to FIG. 8 below.

Information about multiple volume meshes created in each of multiple nozzle units is stored in the nozzle library D10 in advance. Accordingly, the nozzle area volume mesh creator 21 may obtain information about volume meshes of at least one selected nozzle unit from the nozzle library D10, without performing computation to create volume meshes in a nozzle area in which a nozzle unit is disposed.

The process chamber volume mesh creator 23 may receive information about volume meshes created by the nozzle area volume mesh creator 21 in a nozzle area and may create multiple volume meshes throughout a process chamber. The process performed by the process chamber volume mesh creator 23 may be performed for multiple process chambers, such as iteratively. While the nozzle area volume mesh creator 21 is creating volume meshes in a nozzle area, the process chamber volume mesh creator 23 may divide a process chamber into the nozzle area, an upper area above the nozzle area, and a lower area below the nozzle area and may define the nozzle area, the upper area, and the lower area. The process chamber volume mesh creator 23 may receive the process chamber inner shape information D20 and may define the upper area, the lower area, and the nozzle area based on the process chamber inner shape information D20.

The process chamber volume mesh creator 23 may perform computation to create multiple volume meshes in the upper area and the lower area. The process chamber volume mesh creator 23 may also combine information about volume meshes created by the nozzle area volume mesh creator 21 in the nozzle area with information about the multiple volume meshes created in the upper area and the lower area through the computation, thereby creating multiple volume meshes throughout the process chamber.

The simulator 25 may be provided with information about volume meshes created by the process chamber volume mesh creator 23 in a process chamber. The simulator 25 may simulate a flow of gas injected through a gas supply inlet of the process chamber based on the information about the volume meshes in the process chamber and may output a simulation result D100. Simulation results may be used to configure a process chamber for use, to optimize a process using the process chamber, and ultimately to manufacture/fabricate semiconductors in an optimized process chamber.

The nozzle area volume mesh creator 21 may receive the simulation result D100 and may newly select a nozzle unit based on the simulation result D100. For example, a new nozzle unit having a different inner diameter than an old nozzle unit may be newly selected as a newly selected nozzle unit. The nozzle area volume mesh creator 21 may reset location coordinates, at which at least one selected nozzle unit will be placed, based on the simulation result D100. For example, the location coordinates may be reset such that the density of nozzles (e.g., number of nozzles per unit area or unit volume) is increased. In other words, the simulation system may newly perform a simulation reflecting the simulation result D100.

Referring to FIG. 3, the nozzle library D10, the process chamber inner shape information D20, and nozzle location coordinates D31 at which nozzle units are placed may be provided to a simulation tool 20_1. A nozzle area volume mesh creator 21_1 may select a nozzle unit using information about multiple nozzle units, which is included in the nozzle library D10. The nozzle area volume mesh creator 21_1 may also receive the nozzle location coordinates D31 and may place at least one selected nozzle unit at location coordinates.

As compared to the nozzle area volume mesh creator 21 shown in FIG. 2, the nozzle area volume mesh creator 21_1 does not directly set location coordinates of a nozzle unit but may place at least one selected nozzle unit at specified location coordinates as received.

Referring to FIG. 4, the nozzle library D10, the process chamber inner shape information D20, the shower head information D30, and a result of performing a process in a process chamber, i.e., a process result D40, may be provided to a simulation tool 20_2.

The process result D40 may be the amount of deposition on a wafer which is an object of a process when a deposition process is performed in a process chamber or may be a wafer etching amount when an etching process is performed in the process chamber. The deposition process performed in the process chamber may be an object of the simulation by the simulator 25. Therefore, the inputs used to obtain a simulation result by the simulator 25 in FIG. 4 may include aspects of the simulation in the process chamber, including a deposition amount or a wafer etching amount.

Alternatively, the process result D40 may be a value obtained by measuring a flow of gas or another physical quantity varying with the flow of gas when a process is actually performed in a process chamber. Therefore, the process of FIG. 4 can be used to prospectively optimize a configuration of a process chamber, and may be based on processes actually performed in the same process chamber or a different (e.g., similar) process chamber.

A nozzle area volume mesh creator 21_2 may select a nozzle unit based on the process result D40 and may set location coordinates at which the selected nozzle unit will be placed. For example, when the amount of deposition in a central area of a wafer is greater than that in an edge area around the central area as a result of performing a deposition process, the nozzle area volume mesh creator 21_2 may dispose a nozzle unit in a central area of a nozzle area, which corresponds to the central area of the wafer, and dispose a different nozzle unit in an edge area of the nozzle area, which corresponds to the edge area of the wafer, or may control the number of nozzle units disposed in each region.

The simulation tools 20, 20_1, and 20_2 shown in FIGS. 2 through 4 use the nozzle library D10 storing information about multiple nozzle units, so that the amount of time taken to simulate a flow of gas can be reduced.

Figure 5A:
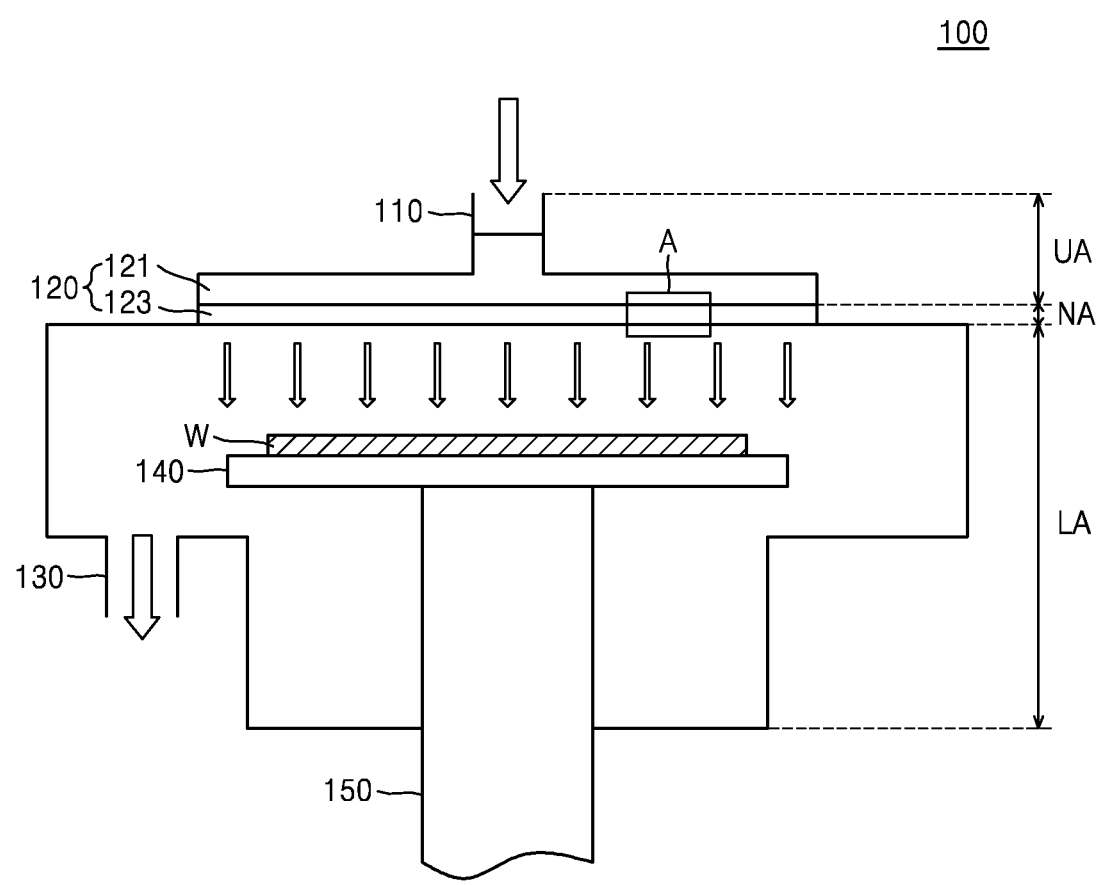
FIG. 5A is a schematic cross-sectional view illustrating a process chamber in which a simulation is performed, according to some embodiments of the present disclosure.
Figure 5B:
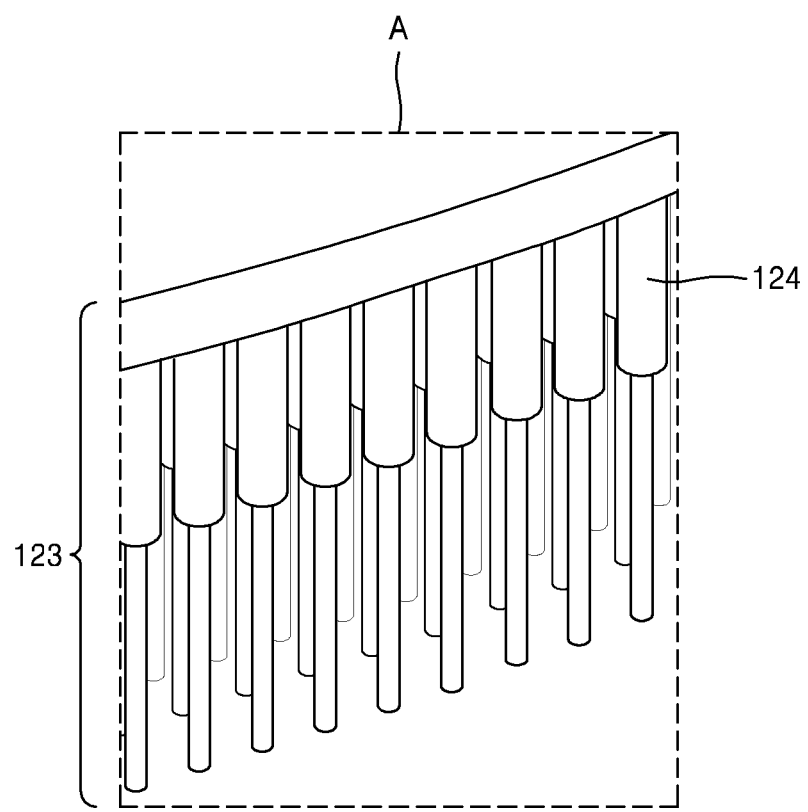
FIG. 5B is an enlarged diagram illustrating the area A shown in FIG. 5A, for explaining multiple nozzles.

FIG. 5A is a schematic cross-sectional view illustrating a process chamber in which a simulation is performed, according to some embodiments of the present disclosure. FIG. 5B is an enlarged diagram illustrating the area A shown in FIG. 5A and is provided to explain multiple nozzles.

Referring to FIG. 5A, a process chamber 100 may include a supply inlet 110, a shower head 120, an exhaust outlet 130, a susceptor 140, and a support 150.

The process chamber 100 may form an independent space separated from outside for efficient progress of processes. The exhaust outlet 130 may be formed at the process chamber 100 and may be connected to a vacuum pump. As the air inside the process chamber 100 is pumped by the vacuum pump, the inside of the process chamber 100 may be maintained in a low or high vacuum state. A deposition process may be performed inside the process chamber 100.

The supply inlet 110 may supply various kinds of gas, microwaves, and/or plasma to the inside of the process chamber 100 through the shower head 120. The shower head 120 may receive reaction gas, purge gas, or other various kinds of gas from the supply inlet 110 and may uniformly disperse and supply the gas into the process chamber 100. The shower head 120 may include a circular upper plate 121 connected to the supply inlet 110 at its center and a circular lower plate 123 at which multiple nozzles are formed.

An area in which gas supplied to the process chamber 100 moves until the gas is discharged outside the process chamber 100 may be subdivided. The area where gas moves may be subdivided into a nozzle area NA corresponding to the circular lower plate 123 at which multiple nozzles are formed, an upper area UA above the nozzle area NA, and a lower area LA below the nozzle area NA.

In a simulation, according to some embodiments of the present disclosure, computation for creating multiple volume meshes in the upper area UA and the lower area LA may be performed, but computation for discretizing the nozzle area NA into multiple volume meshes may not be performed and at least one nozzle unit may be selected from among multiple nozzle units stored in a nozzle library. Therefore, the amount of time taken to create multiple volume meshes in the nozzle area NA may be reduced, so that the amount of time taken to simulate a flow of gas may also be reduced.

Referring to FIGS. 5A and 5B, the circular lower plate 123 may include multiple of the nozzles 124. A through hole in a cylindrical shape may be formed inside the nozzles 124. The nozzles 124 may be arranged corresponding to a position at which a wafer W is mounted. Although the nozzles 124 have a structure in which two cylinders having different diameters are connected to each other in FIG. 5B, the nozzles 124 are not limited thereto.

Referring back to FIG. 5A, the wafer W may be seated on the susceptor 140. A seating part may be provided at the susceptor 140. The wafer W may be seated on the seating part of the susceptor 140. The susceptor 140 may support the wafer W and may fix the wafer W during processes. For example, the susceptor 140 may fix the wafer W using a vacuum method or an electrostatic method.

The susceptor 140 may function as one of two electrodes for forming plasma. The susceptor 140 may be made of material which absorbs electromagnetic energy and converts the absorbed energy into heat. The susceptor 140 may be moved up and down and rotated by the support 150.

Figure 6:
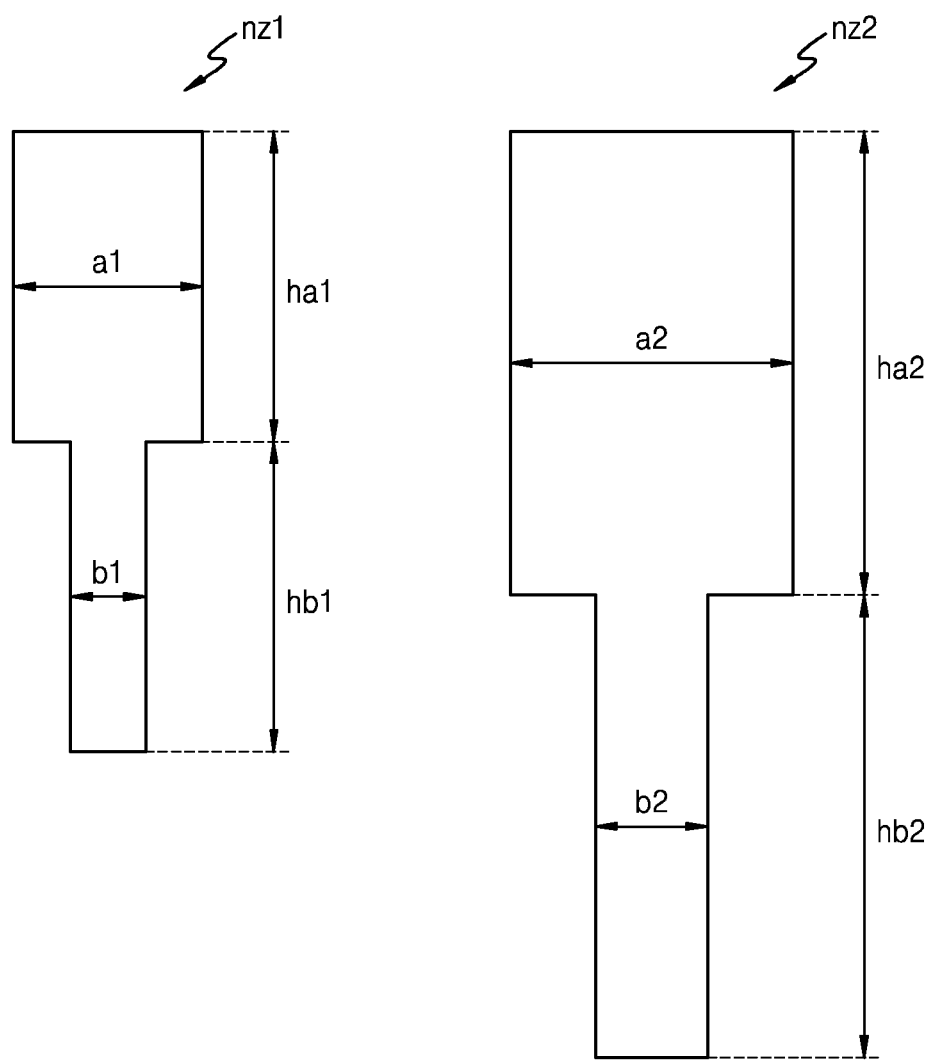
FIG. 6 is a diagram for explaining information about multiple nozzle units as stored in a nozzle library of a simulation system, according to some embodiments of the present disclosure.

FIG. 6 is a diagram for explaining information about multiple nozzle units as stored in a nozzle library of a simulation system, according to some embodiments of the present disclosure. FIG. 6 shows cross-sectional views of nozzle units.

Referring to FIG. 6, the nozzle library may include information about the shape of each of the nozzle units. For example, the nozzle library may include information about a first nozzle unit nz1 and information about a second nozzle unit nz2.

The shape of the first nozzle unit nz1 may be different from that of the second nozzle unit nz2. The first nozzle unit nz1 and the second nozzle unit nz2 may have a shape in which two cylinders having different diameters are combined with each other and the diameter and height of each cylinder may be included in the nozzle library. The height may refer to a total distance of the entirety of a nozzle unit from one extremity to the other perpendicular to a plane in which the diameter is measured. The entirety of the nozzle unit may include a first cylinder and a second cylinder, aligned and attached in the height direction as shown in FIG. 6. Accordingly, the nozzle library may include a diameter a1 and a height ha1 of the first cylinder of the first nozzle unit nz1, a diameter b1 and a height hb1 of the second cylinder of the first nozzle unit nz1, a diameter a2 and a height ha2 of the first cylinder of the second nozzle unit nz2, and a diameter b2 and a height hb2 of the second cylinder of the second nozzle unit nz2. The diameter of a nozzle unit may be a diameter of a cylinder hole (or an aperture) inside the nozzle unit.

The drawings here are only provided to explain the embodiments of the present disclosure and the inventive concepts described herein are not limited to the shapes of the first nozzle unit nz1 and the second nozzle unit nz2 shown in the drawings. The nozzle library may also include information about a nozzle unit having a different shape from those shown in the drawings. Additionally, information about an angle formed between a nozzle unit and a circular upper plate (e.g., 121 in FIG. 5A) when the nozzle unit is disposed in a nozzle area may be included in the nozzle library. Additionally, the number of nozzle units in the nozzle library is not limited to two nozzle units, and may be tens, dozens, hundreds, thousands or even more different nozzle units.

At least one nozzle unit may be selected from among the first nozzle unit nz1 and the second nozzle unit nz2 based on the inner shape (e.g., volume, dimensions, arrangement of components and elements therein) of a process chamber. The nozzle library may also include information about multiple volume meshes formed in the inner space of each of the first nozzle unit nz1 and the second nozzle unit nz2.

Accordingly, in a simulation of a flow of gas inside a process chamber, when at least one nozzle unit is selected from among the first nozzle unit nz1 and the second nozzle unit nz2, information about multiple volume meshes in the selected nozzle unit may be obtained from the nozzle library. The multiple volume meshes will be described in detail with reference to FIGS. 7A and 7B below.

Figure 7A:
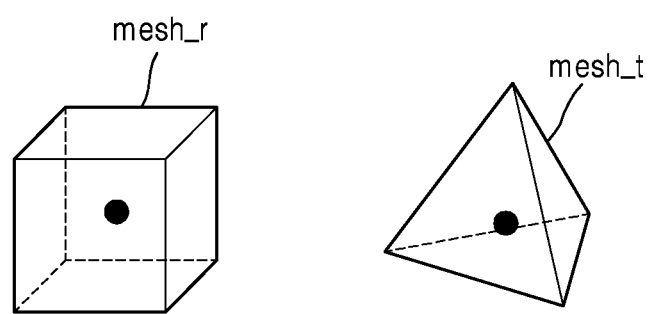
FIG. 7A is a diagram for explaining the shape of a volume mesh formed inside a nozzle unit.
Figure 7B:
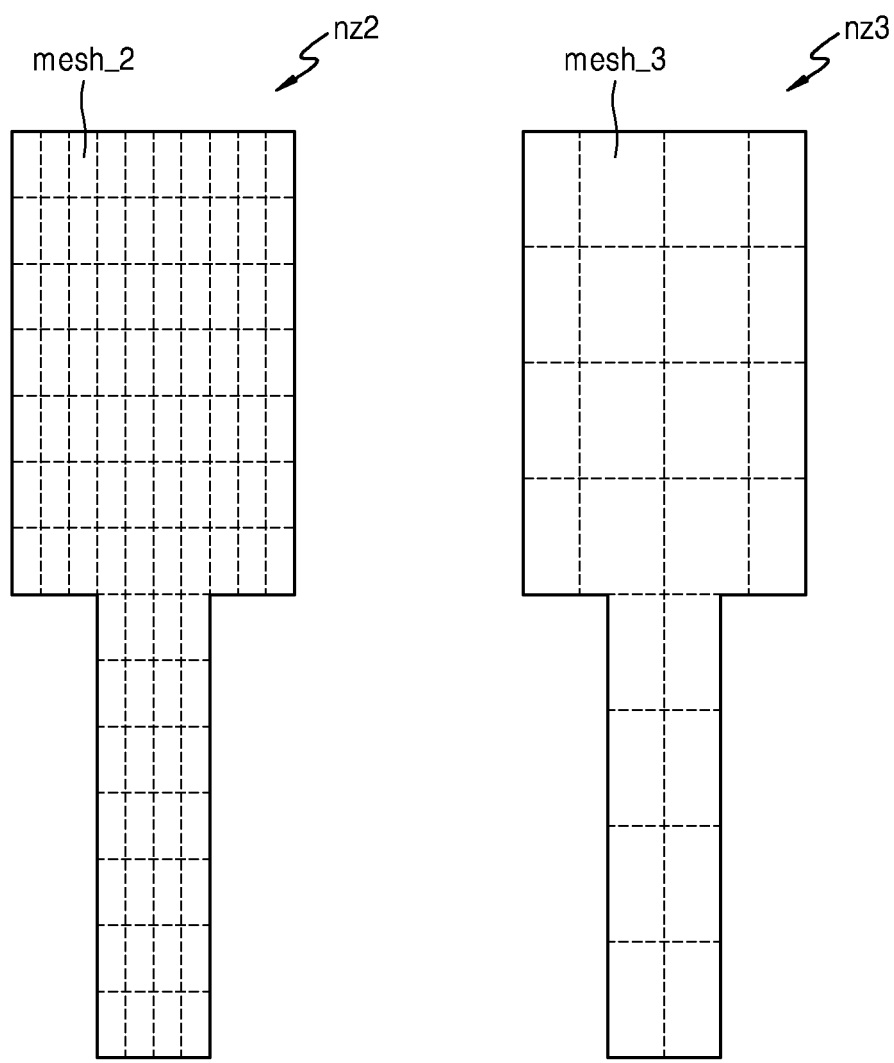
FIG. 7B is a diagram for explaining information about multiple nozzle units as stored in a nozzle library of a simulation system, according to other embodiments of the present disclosure.

FIG. 7A is a diagram for explaining the shape of a volume mesh formed inside a nozzle unit. FIG. 7B is a diagram for explaining information about multiple nozzle units as stored in a nozzle library of a simulation system, according to other embodiments of the present disclosure. FIG. 7B shows cross-sectional views of nozzle units.

Referring to FIG. 7A, each of multiple volume meshes formed inside a nozzle unit may have a polyhedral shape. For example, each of the volume meshes may have a hexahedral shape mesh_r or a tetrahedral shape mesh_t. As the shape of the volume meshes changes, the amount of time taken to simulate a flow of gas inside a nozzle unit and the accuracy of a simulation result may also be changed. Although volume meshes have the hexahedral shape mesh_r or the tetrahedral shape mesh_t in the embodiments illustrated in FIG. 7A, volume meshes having various shapes may be formed inside a nozzle unit in another embodiment.

Referring to FIGS. 7A and 7B, the nozzle library may include information about the second nozzle unit nz2 and information about a third nozzle unit nz3. The shape of the second nozzle unit nz2 may substantially be the same as that of the third nozzle unit nz3. The second nozzle unit nz2 and the third nozzle unit nz3 may have a shape in which two cylinders having different diameters are combined with each other. As described above with reference to FIG. 6, at least one item among the diameter and height of each cylinder and an angle at which a nozzle unit is connected to a shower head may be included in the nozzle library.

Volume meshes created in the second nozzle unit nz2 may have different characteristics than those created in the third nozzle unit nz3. For example, volume meshes mesh 2 formed in the second nozzle unit nz2 and volume meshes mesh 3 formed in the third nozzle unit nz3 have the same hexahedral shape mesh_r but may have different sizes. The density of the volume meshes mesh_2 formed in the second nozzle unit nz2 may be different from that of the volume meshes mesh_3 formed in the third nozzle unit nz3. The term density may refer to the number of individual delineated faces visible in a specified cross-sectional area or the number of individual delineated portions, components or pieces present in a specified volume. As seen in FIG. 7B, the second nozzle unit nz2 and the third nozzle unit nz3 have the same or substantially the same cross-sectional areas for the wider sections at the tops and the narrower sections at the bottoms, but different numbers of individual delineated faces visible in the cross-sectional areas of the corresponding sections. Therefore, the second nozzle unit nz2 may have a density of volume meshes (identifiable by delineated faces) different than a density of volume meshes of the third nozzle unit nz3.

A nozzle library included in a simulation system according to some embodiments of the present disclosure may include information about nozzle units having the same shape. The nozzle library may also include information about volume meshes (e.g., shapes and densities of the volume meshes) formed in the nozzle units having the same shape.

The simulation system may discretize the inner space of a process chamber into multiple volume meshes, set up an equation of motion of each volume mesh, and compute flow of gas using a numerical algorithm. Accordingly, as the number of volume meshes formed in a nozzle unit increases, the amount of computation of the simulation system increases, and therefore, a simulation time also increases. However, as the number of volume meshes increases, the accuracy of the computation may also increase. Accordingly, when the simulation system (e.g., the nozzle area volume mesh creators 21, 21_1, or 21_2 shown in FIG. 2, 3, or 4) selects a nozzle unit having a particular shape, the simulation system may select at least one nozzle unit from among multiple nozzle units in which volume meshes having different characteristics are created, taking account of the accuracy and time of computation.

The drawings here are only provided to explain the embodiments of the present disclosure. Although the volume meshes formed in the second nozzle unit nz2 have the same shape and size and the volume meshes formed in the third nozzle unit nz3 have the same shape and size in FIG. 7B, the inventive concepts described herein are not limited thereto. Multiple volume meshes formed in a single nozzle unit may have different sizes. For example, small-size volume meshes may be disposed in a region of a nozzle unit (e.g., a region where two cylinders having different diameters are connected to each other) that also includes large-size volume meshes disposed therein in another region. The small-size volume meshes may require accurate computation, whereas the large-size volume meshes may be appropriate for fast computation. The information about the nozzle unit including the small-size volume meshes and/or the large-size volume meshes may be included in a nozzle library.

Figure 8:
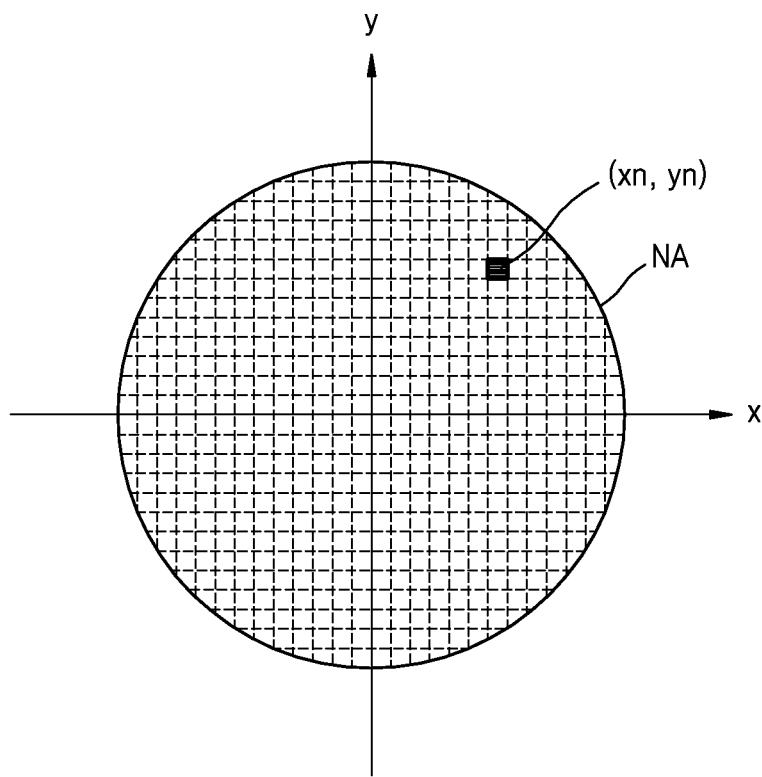
FIG. 8 is a diagram illustrating location coordinates at which a nozzle unit will be placed in a nozzle area.

FIG. 8 is a diagram illustrating location coordinates at which a nozzle unit will be placed in a nozzle area. FIG. 8 is provided to explain the operation of the nozzle area volume mesh creators 21, 21_1, and 21_2 shown in FIGS. 2 through 4.

Referring to FIG. 8, a lower plate (e.g., 123 in FIG. 5A) of a shower head may have a circular plate shape, and therefore, the nozzle area NA in which multiple nozzle units are disposed may also have a circular plate shape. Location coordinates at which a nozzle unit will be placed in the nozzle area NA may be set with respect to the center of the circle. The location coordinates may indicate the center of a region where the nozzle unit is disposed. For example, a pair of location coordinates at which a single nozzle unit will be placed may be (xn, yn) with respect to the center of a nozzle surface at which the nozzle unit is disposed.

The location coordinates may be set in advance and a simulation system may dispose each nozzle unit to correspond to the set location coordinates.

Alternatively, the location coordinates do not have to be set in advance, but a simulation system (e.g., the nozzle area volume mesh creator 21 in FIG. 2) may dynamically set the location coordinates based on information about the shape of a shower head.

Although location coordinates are uniformly plotted on the nozzle area NA in FIG. 8, location coordinates are not limited thereto. A simulation system may plot location coordinates more densely on a region of a nozzle area corresponding to a wafer region, to which gas is supposed to more uniformly supplied, than on other regions of the nozzle area. Nozzle units selected based on a nozzle library may be placed at the location coordinates.

Figure 9A:
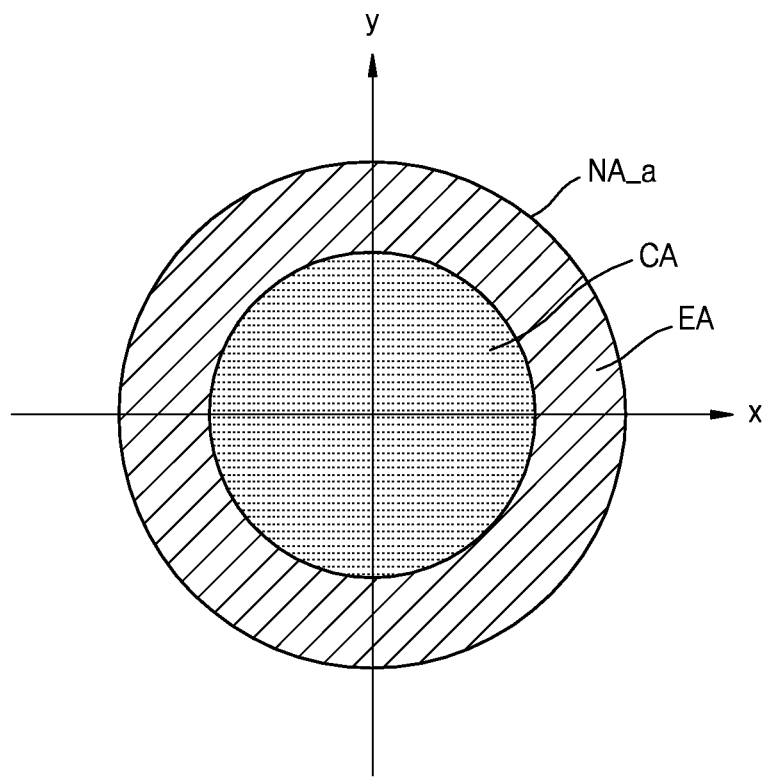
FIGS. 9A and 9B are diagrams for explaining a nozzle area in which multiple nozzles are disposed.

FIG. 9A is a diagram for explaining a nozzle area in which multiple nozzle units are disposed.

Referring to FIG. 9A, a nozzle area NA_a in which multiple nozzles are disposed may include a central area CA at a central portion thereof and an edge area EA surrounding the central area CA.

A nozzle area volume mesh creator (e.g., 21, 21_1, or 21_2 shown in FIG. 2, 3, or 4) may receive the nozzle library D10 and may select a nozzle unit using information about multiple nozzle units included in the nozzle library D10. The nozzle area volume mesh creators 21, 21_1, or 21_2 may set a range occupied by the central area CA in the nozzle area NA_a based on at least one item among the process chamber inner shape information D20, the shower head information D30, and the process result D40.

The nozzle area volume mesh creators 21, 21_1, or 21_2 may select multiple nozzle units, for example, two nozzle units, e.g., a first nozzle unit (e.g., nz1 in FIG. 6) and a second nozzle unit (e.g., nz2 in FIG. 6) having different shapes. The nozzle area volume mesh creators 21, 21_1, or 21_2 may dispose the first nozzle unit nz1 in the central area CA and the second nozzle unit nz2 in the edge area EA. However, the nozzle area volume mesh creators 21, 21_1, or 21_2 are not limited thereto and the nozzle area volume mesh creators 21, 21_1, or 21_2 may dispose the second nozzle unit nz2 in the central area CA and the first nozzle unit nz1 in the edge area EA.

As described above with reference to FIG. 4, the range of the central area CA and at least one item among a.) the shape of a nozzle unit disposed in each of the central area CA and the edge area EA and b.) the number of nozzle units disposed in each of the central area CA and the edge area EA, may be changed according to a result (e.g., the process result D40 in FIG. 4) of actually performing a process. The shape of a nozzle unit disposed in each of the central area CA and the edge area EA and the range of the central area CA may be changed, taking account of aging effect occurring due to repetitive use of a process chamber.

Alternatively, the nozzle area volume mesh creators 21, 21_1, or 21_2 may select a second nozzle unit (e.g., nz2 in FIG. 7B) and a third nozzle unit (e.g., nz3 in FIG. 7B) which have the same shape but have different volume meshes. For example, the nozzle area volume mesh creators 21, 21_1, or 21_2 may dispose the second nozzle unit nz2 in the central area CA and the third nozzle unit nz3 in the edge area EA. The nozzle area volume mesh creators 21, 21_1, or 21_2 may dispose the second nozzle unit nz2 in an area requiting more accurate computation between the central area CA and the edge area EA and dispose the third nozzle unit nz3 in the other area for fast computation.

Figure 9B:
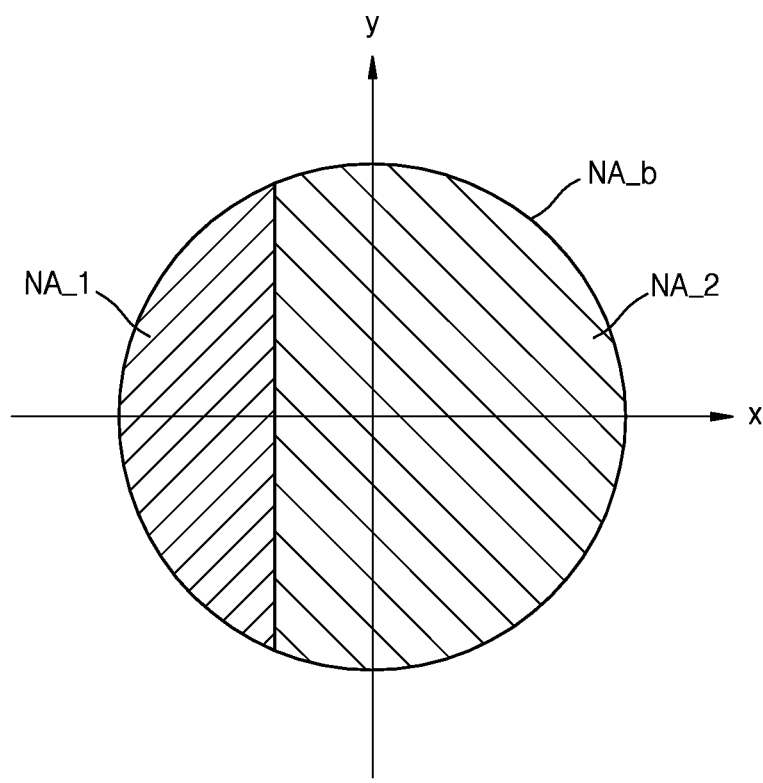

FIG. 9B is a diagram for explaining a nozzle area in which multiple nozzles are disposed.

Referring to FIGS. 5A and 9B, a nozzle area NA_b, in which multiple nozzle units are disposed, may include a first area NA_1 near to the exhaust outlet 130 and a second area NA_2 farther from the exhaust outlet 130 than the first area NA_1. Since gas is injected into the process chamber 100 through the supply inlet 110 and is discharged outside through the exhaust outlet 130, the first area NA_1 near to the exhaust outlet 130 may require accurate computation.

A nozzle area volume mesh creator (e.g., 21, 21_1, or 21_2 shown in FIG. 2, 3, or 4) may select a nozzle unit using information about multiple nozzle units included in the nozzle library D10. The nozzle area volume mesh creators 21, 21_1, or 21_2 may set a range occupied by the first area NA_1 in the nozzle area NA_b based on at least one item among the process chamber inner shape information D20, the shower head information D30, and the process result D40.

The nozzle area volume mesh creators 21, 21_1, or 21_2 may dispose two nozzle units having different shapes in the first area NA_1 and the second area NA_2, respectively. For example, the nozzle area volume mesh creators 21, 21_1, or 21_2 may dispose a first nozzle unit (e.g., nz1 in FIG. 6) and a second nozzle unit (e.g., nz2 in FIG. 6), which have different shapes, in the first area NA_1 and the second area NA_2, respectively. The range of the first area NA_1 in the nozzle area NA_b and the shape of a nozzle unit disposed in each of the first area NA_1 and the second area NA_2 may be set based on the position of the exhaust outlet 130 in the process chamber 100.

Alternatively, the nozzle area volume mesh creators 21, 21_1, or 21_2 may select a second nozzle unit (e.g., nz2 in FIG. 7B) and a third nozzle unit (e.g., nz3 in FIG. 7B) which have the same shape but have different volume meshes. For example, the nozzle area volume mesh creators 21, 21_1, or 21_2 may dispose the second nozzle unit nz2 in the first area NA_1 and the third nozzle unit nz3 in the second area NA_2. The characteristics of volume meshes created in a nozzle unit disposed in each of the first area NA_1 and the second area NA_2 may be determined based on the position of the exhaust outlet 130 in the process chamber 100.

Although the nozzle areas NA_a and NA_b are subdivided into two areas and different nozzle units are respectively disposed in the two areas in FIGS. 9A and 9B, the nozzle areas NA_a and NA_b are not limited thereto and a nozzle area may be subdivided into at least three areas and at least three different nozzle units may be selected and respectively disposed in the at least three areas.

Figure 10:
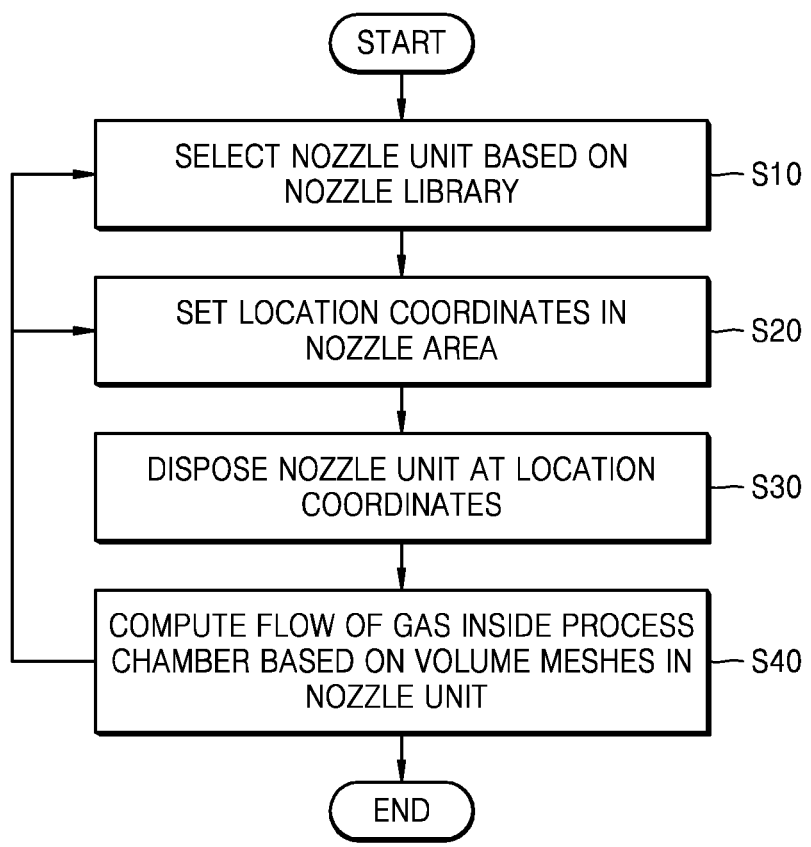
FIGS. 10 and 11 are flowcharts illustrating a simulation method according to some embodiments of the present disclosure.
Figure 11:
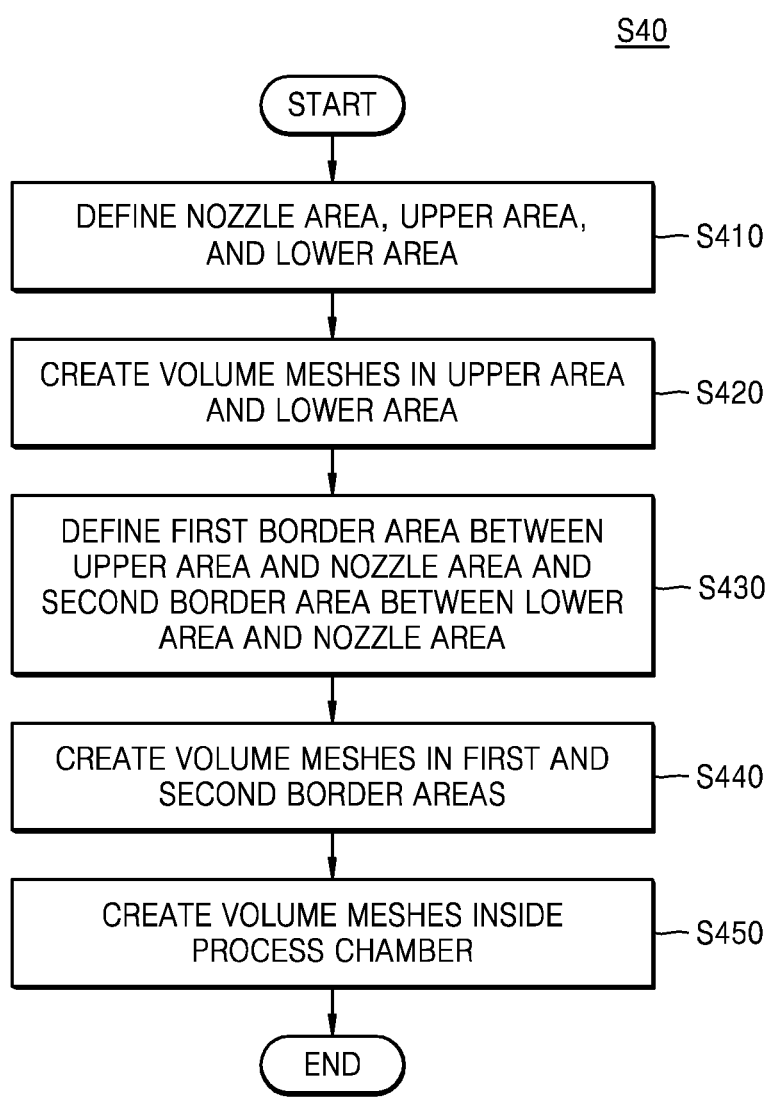

FIGS. 10 and 11 are flowcharts illustrating a simulation method according to some embodiments of the present disclosure.

Referring to FIG. 10, at least one nozzle unit to be disposed in a nozzle area of a shower head may be selected based on a nozzle library in operation S10. The nozzle library may include information about the shape of each of multiple nozzle units and information about multiple volume meshes created in each of the nozzle units. At least one nozzle unit may be selected based on the inner shape (e.g., the position of an exhaust outlet) of a process chamber or based on aging effect of a nozzle unit disposed in the nozzle area.

Location coordinates at which each of the at least one selected nozzle unit will be placed may be set in operation S20. The location coordinates may be set based on the shape of the shower head. For example, location coordinates may be set such that location coordinates are plotted more densely on a partial area of the nozzle area corresponding to a wafer area, to which gas is supposed to be uniformly supplied, than on the other area(s) of the nozzle area.

The at least one nozzle unit may be placed at the set location coordinates in operation S30. When multiple nozzle units are selected, the nozzle area may be subdivided to respectively correspond to the multiple nozzle units and the nozzle units may be respectively disposed in the subdivided nozzle areas (e.g., the central area CA and the edge area EA in FIG. 9A).

Since the information about multiple volume meshes created in each of the nozzle units is stored in the nozzle library, computation for creating volume meshes for the nozzle area is not needed. A flow of gas inside the process chamber may be computed based on volume meshes in each nozzle unit which has been disposed in operation S40.

When a result of simulating a flow of gas inside the process chamber does not meet a target value or the computation is impossible, a nozzle unit may be newly selected based on the simulation result in operation S10. For example, a new nozzle unit having a different inner diameter than the old nozzle unit may be selected. One, more than one, or all of the features of claim 9A may be automated, such that computations may be systematically performed in sequence for multiple nozzle units in order to optimize the identification of a suitable or even optimal nozzle unit for any particular process or any particular process chamber.

Location coordinates at which the selected at least one nozzle unit will be placed may be newly set based on the simulation result in operation S20. For example, new location coordinates of nozzle units may be set to have lower density than the old location coordinates of the nozzle units.

According to some embodiments of the present disclosure, a gas flow simulation method does not require computation for creating volume meshes for a nozzle area since information about multiple nozzles is stored in a nozzle library in advance. Accordingly, the amount of time taken to simulate a flow of gas inside a process chamber may be reduced.

Figure 12:
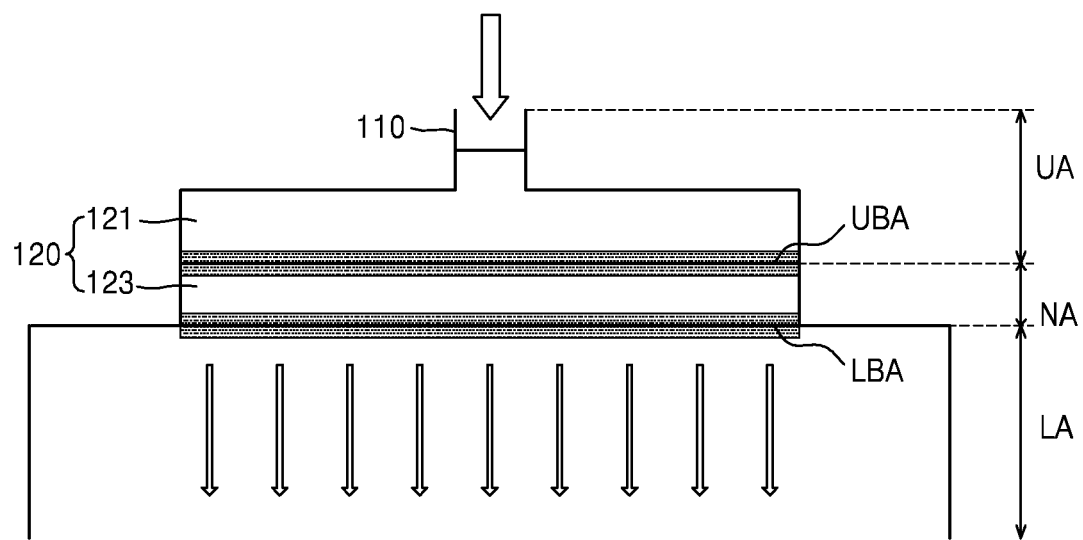
FIG. 12 is a schematic enlarged diagram illustrating a portion of the process chamber shown in FIG. 5A.

FIG. 11 is a flowchart for explaining in detail operation S30 shown in FIG. 10. FIG. 12 is a schematic enlarged diagram illustrating a portion of the process chamber shown in FIG. 5A.

Referring to FIGS. 11 and 12, the process chamber may be divided into the nozzle area NA in which multiple nozzle units are disposed, the upper area UA above the nozzle area NA, and the lower area LA below the nozzle area NA in operation S410. The upper area UA, the lower area LA, and the nozzle area NA may be defined based on process chamber inner shape information.

Computation for creating multiple volume meshes in the upper area UA and in the lower area LA may be performed in operation S420. A first border area UBA between the upper area UA and the nozzle area NA and a second border area LBA between the lower area LA and the nozzle area NA may be defined in operation S430 to connect and combine the volume meshes in the lower area LA, the volume meshes in the upper area UA, and volume meshes in the nozzle area NA with one another.

Since the volume meshes in the nozzle area NA, the volume meshes in the upper area UA, and the volume meshes in the lower area LA are created through separate procedures, volume meshes formed in the first border area UBA and volume meshes formed in the second border area LBA may maintain continuity in a modified form. Accordingly, computation for newly creating volume meshes in the first border area UBA and the second border area LBA may be performed in operation S440. Volume meshes may be created inside the process chamber based on the volume meshes in each of the upper area UA, the lower area LA, the nozzle area NA, the first border area UBA, and the second border area LBA in operation S450.

Figure 13:
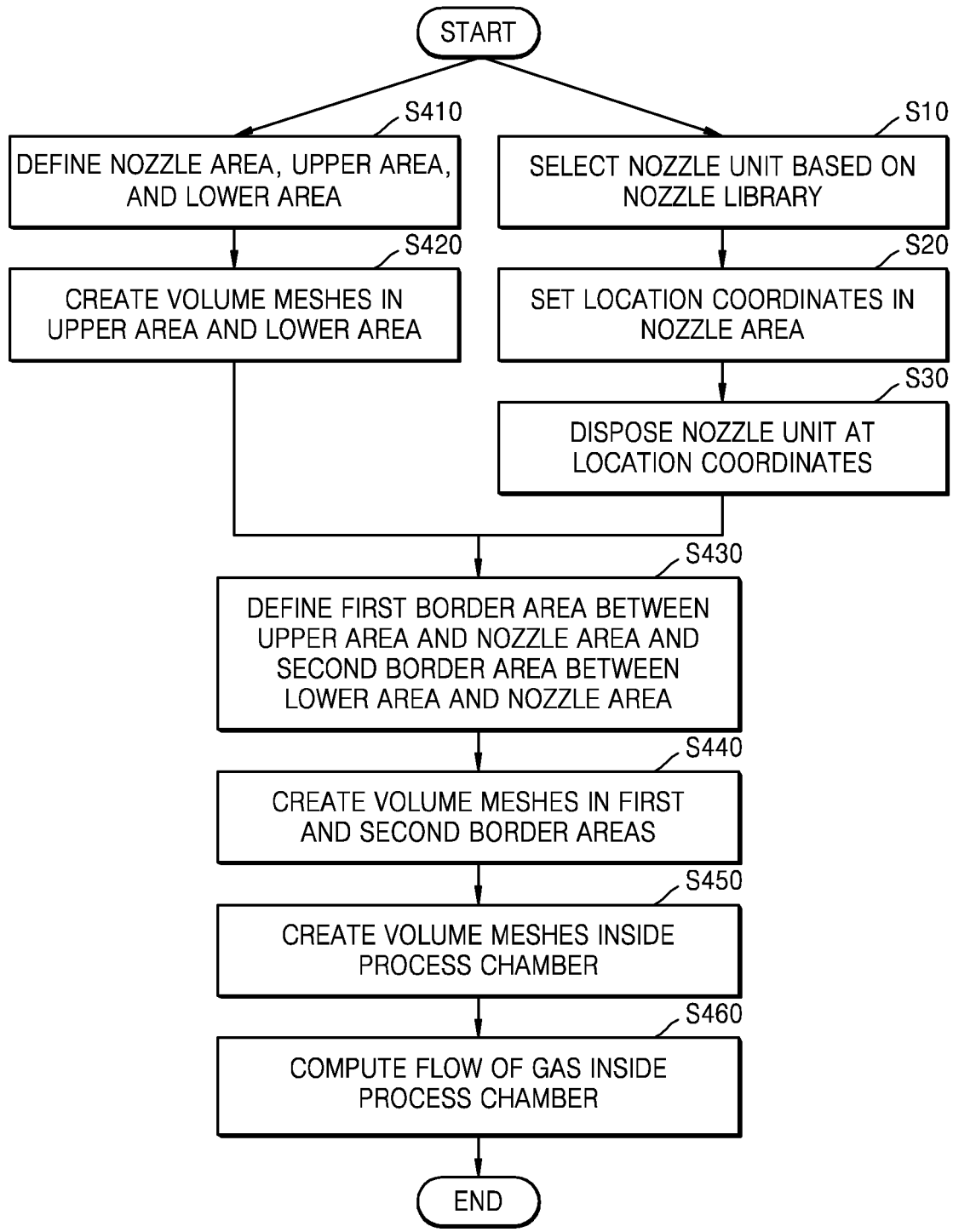
FIG. 13 is a flowchart illustrating a simulation method according to other embodiments of the present disclosure.

FIG. 13 is a flowchart illustrating a simulation method according to other embodiments of the present disclosure. FIG. 13 shows that some operations shown in FIGS. 10 and 11 may be performed in parallel. Reference characters described in FIGS. 10 and 11 will be omitted below.

Referring to FIG. 13, defining the nozzle area, the upper area, and the lower area in operation S410 and creating the volume meshes in the upper and lower areas in operation S420 may be sequentially performed. Selecting at least one nozzle unit based on the nozzle library in operation S10, setting the location coordinates on the nozzle area in operation S20, and disposing the selected nozzle unit at the location coordinates in operation S30 may also be sequentially performed.

While operations S410 and S420 are being performed, operations S10, S20, and S30 may be performed. In some embodiments, defining the nozzle area, the upper area, and the lower area in operation S410 may be performed in parallel with selecting at least one nozzle unit based on the nozzle library in operation S10. In other embodiments, creating the volume meshes in the upper and lower areas in operation S420 may be performed in parallel with setting the location coordinates on the nozzle area in operation S20.

A first border area UBA between the upper area UA and the nozzle area NA and a second border area LBA between the lower area LA and the nozzle area NA may be defined in operation S430. Volume meshes in the first border area UBA and the second border area LBA may be created in operation S440. Volume meshes may be created inside the process chamber based on the volume meshes in each of the upper area UA, the lower area LA, the nozzle area NA, the first border area UBA, and the second border area LBA in operation S450. A flow of gas inside the process chamber may be computed in operation S460.

In the gas flow simulation method described herein according to the current embodiments, creating volume meshes for a nozzle area and creating volume meshes for the area(s) other than the nozzle area may be performed at the same time. As a result, the amount of time taken to simulate a flow of gas inside a process chamber can be reduced.

Figure 14:
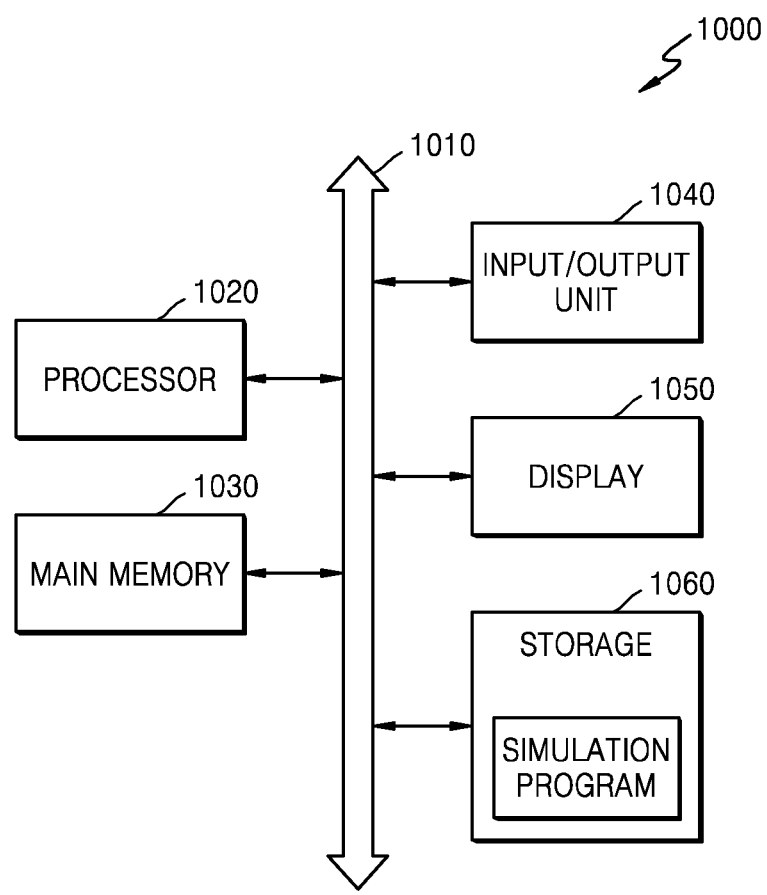
FIG. 14 is a block diagram illustrating a computing system that performs a simulation method, according to some embodiments of the present disclosure.

FIG. 14 is a block diagram illustrating a computing system 1000 performing a simulation method, according to some embodiments of the present disclosure.

Referring to FIG. 14, the computing system 1000 may include a system bus 1010, a processor 1020, main memory 1030, an input/output unit 1040, a display 1050, and storage 1060.

The processor 1020 may be formed of a single core or multiple cores. The input/output unit 1040 may be a keyboard, a mouse, or a printer. The main memory 1030 may be volatile memory such as DRAM or static RAM (SRAM). The display 1050 may include a display device such as a liquid crystal display (LED), a light-emitting diode (LED) display, or an organic LED (OLED) display. The storage 1060 may be non-volatile memory such as a hard disc drive (HDD) or a solid-state drive (SSD).

The storage 1060 may store program codes (e.g., computer-readable program codes) for performing the simulation methods described above. Program code may be loaded to the main memory 1030 and executed by the processor 1020 and the execution result, i.e., a simulation result, may be output to the input/output unit 1040 or the display 1050. The storage 1060 may store operational information for simulating a flow of gas inside a process chamber. The program codes may include codes for performing the gas flow simulation. The storage 1060 may store a nozzle library including information about multiple nozzle units.

While the inventive concepts of the present disclosure have been particularly shown and described with reference to embodiments thereof, it will be understood that various changes in form and details may be made therein without departing from the spirit and scope of the following claims.

What is claimed is:

1. A computing system for simulating a flow of gas supplied into a process chamber through a shower head, the computing system comprising:

memory configured to store instructions and a nozzle library comprising information about a plurality of nozzle units having differing shapes and each of which has a plurality of volume meshes formed therein; and a processor configured to access the memory and to execute the instructions, wherein, when executed by the processor, the instructions cause the processor to execute a process comprising:

selecting at least one nozzle unit as a selected at least one nozzle unit for the shower head based on the nozzle library, and placing the selected at least one nozzle unit at corresponding location coordinates;

creating a plurality of volume meshes for the process chamber using the plurality of volume meshes formed in an inner space of the selected at least one nozzle unit; and outputting a simulation result by simulating the flow of the gas through the selected at least one nozzle unit in the process chamber based on the plurality of volume meshes in the process chamber, wherein simulating the flow of the gas comprises:

dividing, by the processor, the process chamber into a nozzle area in which a plurality of nozzles are disposed, an upper area above the nozzle area, and a lower area below the nozzle area, defining, by the processor, the nozzle area, the upper area, and the lower area, and wherein the plurality of volume meshes for the process chamber are created by the processor in the upper area and in the lower area in parallel with setting the location coordinates to reduce the simulation time.

2. The computing system of claim 1, wherein the nozzle library comprises a height of each of the nozzle units and a diameter of an aperture of each nozzle unit, and the selection of the selected at least one nozzle unit is based on at least one of the height of the selected at least one nozzle unit and the diameter of the aperture of the at least one nozzle unit.

3. The computing system of claim 1, wherein the nozzle library comprises information about a first nozzle unit and a second nozzle unit having the same shape as the first nozzle unit, a plurality of first volume meshes created in the first nozzle unit have a different density than a plurality of second volume meshes created in the second nozzle unit, and the selection of the selected at least one nozzle unit is based on at least one of the information about the first nozzle unit and the information about the second nozzle unit.

4. The computing system of claim 1, wherein the process performed when the instructions are executed further comprises receiving information about a shape of the shower head and setting, based on the shape of the shower head, the location coordinates at which the selected at least one nozzle unit is placed.

5. The computing system of claim 1, wherein the process performed when the instructions are executed further comprises receiving information about the location coordinates from outside of the computing system as received information about the location coordinates, and placing the at least one nozzle unit at the location coordinates corresponding to the received information about the location coordinates.

6. The computing system of claim 1, wherein the process performed when the instructions are executed further comprises selecting a subset of the plurality of nozzle units having different shapes and placing the selected nozzle units at the location coordinates based on a shape of the process chamber.

7. A computing system for simulating a flow of gas supplied into a process chamber, the computing system comprising:

memory configured to store instructions and a nozzle library comprising information about a first nozzle unit in which a first plurality of volume meshes are formed and a second nozzle unit in which a second plurality of volume meshes are formed, a characteristic of the first volume meshes being different from a characteristic of the second volume meshes; and a processor configured to access the memory and to execute the instructions, wherein, when executed by the processor, the instructions cause the computing system to execute a process comprising:

selecting at least one nozzle unit as a selected at least one nozzle unit based on the nozzle library and placing the selected at least one nozzle unit at corresponding location coordinates;

creating a plurality of volume meshes for the process chamber using the plurality of volume meshes formed in an inner space of the selected at least one nozzle unit; and outputting a simulation result by simulating the flow of the gas in the process chamber through the selected at least one nozzle unit based on the plurality of volume meshes in the process chamber, wherein simulating the flow of the gas comprises:

dividing, by the processor, the process chamber into a nozzle area in which a plurality of nozzles are disposed, an upper area above the nozzle area, and a lower area below the nozzle area, defining, by the processor, the nozzle area, the upper area, and the lower area; and creating, by the processor, the plurality of volume meshes in the upper area and in the lower area, and wherein the processor creates the plurality of volume meshes in the upper and the lower areas in parallel with setting the location coordinates to reduce the simulation time.

8. The computing system of claim 7, wherein the plurality of volume meshes are polyhedral.

9. The computing system of claim 7, wherein a density of the volume meshes in the second nozzle unit is higher than a density of the volume meshes in the first nozzle unit.

10. The computing system of claim 7, wherein the nozzle area comprises a central area at a central portion of the nozzle area and an edge area surrounding the central area; and the process performed when the instructions are executed further comprises selecting the first nozzle unit and the second nozzle unit, disposing the first nozzle unit in the central area, and disposing the second nozzle unit in the edge area.

11. The computing system of claim 7, wherein the process chamber comprises an exhaust outlet through which the gas is discharged;

the nozzle area comprises a first area near the exhaust outlet and a second area farther from the exhaust outlet than the first area; and the process performed when the instructions are executed further comprises selecting the first nozzle unit and the second nozzle unit, disposing the first nozzle unit in the first area, and disposing the second nozzle unit in the second area.

12. A method of simulating a flow of gas supplied into a process chamber, the method comprising:

selecting, by a processor, at least one nozzle unit as a selected at least one nozzle unit based on a nozzle library, stored in a memory, comprising information about a first nozzle unit in which a first plurality of volume meshes are formed and a second nozzle unit in which a second plurality of volume meshes are formed, a characteristic of the first plurality of volume meshes being different from a characteristic of the second plurality of volume meshes;

setting, by the processor, location coordinates at which the selected at least one nozzle unit is to be placed;

placing, by the processor, the selected at least one nozzle unit at the location coordinates; and outputting, by the processor, a simulation result by computing the flow of the gas through the selected at least one nozzle unit in the process chamber using volume meshes formed in an inner space of the selected at least one nozzle unit placed at the location coordinates, wherein computing the flow of the gas comprises:

dividing, by the processor, the process chamber into a nozzle area in which a plurality of nozzles are disposed, an upper area above the nozzle area, and a lower area below the nozzle area, defining, by the processor, the nozzle area, the upper area, and the lower area; and creating, by the processor, a plurality of volume meshes in the upper area and in the lower area, and wherein the processor creates the plurality of volume meshes in the upper and the lower areas in parallel with setting the location coordinates to reduce the simulation time.

13. The method of claim 12, further comprising:

defining, by the processor, a first border area between the upper area and the nozzle area and a second border area between the lower area and the nozzle area; and reforming, by the processor, volume meshes in the first and second border areas based on volume meshes in the nozzle area, volume meshes in the upper area, and volume meshes in the lower area.

14. The method of claim 12, wherein the defining, by the processor, of the nozzle area, the upper area, and the lower area is performed in parallel with the selecting of the selected at least one nozzle unit.

15. The method of claim 12, wherein the process chamber comprises an exhaust outlet through which the gas is discharged;

the nozzle area comprises a first area near the exhaust outlet and a second area farther from the exhaust outlet than the first area;

the selecting of the selected at least one nozzle unit comprises selecting the first nozzle unit and the second nozzle unit; and the placing, by the processor, the selected at least one nozzle unit at the location coordinates comprises disposing the first nozzle unit in the first area and disposing the second nozzle unit in the second area.

16. The method of claim 12, further comprising:

newly selecting, by the processor, a nozzle unit different from the selected at least one nozzle unit as a newly selected nozzle unit, based on the simulation result; and placing, by the processor, the newly selected nozzle unit at the location coordinates.

17. The method of claim 12, further comprising:

resetting, by the processor, the location coordinates based on the simulation result; and placing, by the processor, the selected at least one nozzle unit at the reset location coordinates.

* * * * *